United States Patent
Charpentier et al.

(10) Patent No.: US 6,746,881 B1
(45) Date of Patent: Jun. 8, 2004

(54) METHOD AND DEVICE FOR CONTROLLING THE THICKNESS OF A LAYER OF AN INTEGRATED CIRCUIT IN REAL TIME

(75) Inventors: Alain Charpentier, Nantes (FR); Dominique Bocquene, Carquefou (FR)

(73) Assignee: Atmel, Nantes SA, Nantes (FR)

(*) Notice: Subject to any disclaimer, the term of this patent is extended or adjusted under 35 U.S.C. 154(b) by 176 days.

(21) Appl. No.: 09/714,524

(22) Filed: Nov. 17, 2000

(30) Foreign Application Priority Data

Nov. 23, 1999 (FR) .......................... 99 14723

(51) Int. Cl.$^7$ ............................ H01L 21/66
(52) U.S. Cl. ........................ 438/14; 438/16
(58) Field of Search .................. 438/14, 16, 18, 438/257, FOR 101, FOR 142; 356/357, 369, 381, 382; 257/E21.521

(56) References Cited

U.S. PATENT DOCUMENTS

| | | | |
|---|---|---|---|
| 5,242,536 A | | 9/1993 | Schoenborn |
| 5,319,197 A | | 6/1994 | Friedhelm |
| 5,362,356 A | * | 11/1994 | Schoenborn ............ 216/60 |
| 5,403,433 A | * | 4/1995 | Morrison et al. ........ 216/60 |
| 5,406,080 A | | 4/1995 | Friedhelm |
| 5,413,966 A | | 5/1995 | Schoenborn |
| 5,450,205 A | * | 9/1995 | Sawin et al. ........... 356/632 |
| 5,807,761 A | * | 9/1998 | Coronel et al. ......... 438/14 |
| 5,955,139 A | * | 9/1999 | Iturralde ............... 427/9 |
| 6,081,334 A | * | 6/2000 | Grimbergen et al. .... 356/499 |

FOREIGN PATENT DOCUMENTS

| | | |
|---|---|---|
| EP | 0 821 396 A2 | 1/1998 |
| WO | WO 90/12415 | 10/1990 |

OTHER PUBLICATIONS

Wolf et al., Silicon Processing for the VLSI era, vol. 1, pp. 234–238, (1986).*

* cited by examiner

*Primary Examiner*—W. David Coleman
*Assistant Examiner*—Brook Kebede
(74) *Attorney, Agent, or Firm*—Stites & Harbison, PLLC; Ross F. Hunt, Jr.

(57) ABSTRACT

A method and a device for measuring in real time the thickness of an integrated circuit layer with the layer to be measured being deposited on an underlying layer. During an engraving operation, the advance of the engraving front generated during the engraving operation is monitored by plotting the optical emission spectrum of the product of the engraving reaction in real time on a spectral component of the underlying layer. A time distribution of the optical emission amplitude of the engraving reaction product is established and the transition of the optical emission amplitude on the distribution as the engraving front passes from the layer to be measured to the underlying layer as established. The thickness of the layer to be measured is thus computed on the basis of the distribution and the transition by a correlation with the transition on the distribution.

7 Claims, 4 Drawing Sheets

SECTION ALONG WIDTH OF THE CHANNEL

1/2 SECTION ALONG LENGHT OF THE CHANNEL

DISTRIBUTION D=I(t)

$\theta = t_1 - t_0$
$e = a.\theta + \beta$

US 6,746,881 B1

METHOD AND DEVICE FOR CONTROLLING THE THICKNESS OF A LAYER OF AN INTEGRATED CIRCUIT IN REAL TIME

FIELD OF THE INVENTION

The invention relates to a method and a device for controlling the thickness of a layer of an integrated circuit in real time during an engraving process.

BACKGROUND OF THE INVENTION

When manufacturing integrated circuits, it may be desirable to measure the thickness of a layer of this integrated circuit deposited during the preceding steps of implementing this manufacturing process.

This is particularly the case when manufacturing memory cells of the EPROM type, where the technology used requires an insulating stack to be provided between two conductive layers, known as a control gate and a floating gate respectively.

The stack produced, more commonly known as ONO, which stands for Oxide, Nitride, Oxide, is made up of a layer of silicon oxide, $SiO_2$, a layer of silicon nitride, $Si_3N_4$, and a second layer of silicon oxide, this stack being sandwiched between the floating electrode and the gate electrode. This structure as a whole, deposited on a silicon substrate of the P type for example, is isolated by a layer of silicon oxide as illustrated by the diagrams of FIG. 1a and 1b giving a view across the width and the length respectively of the channel.

The structure and the stack thus formed constitute part of the core of the EPROM memory cell and can be programmed in particular by injecting electric charges into the first conductive layer or floating gate, the programming state being memorised by maintaining the injected charge over time.

The thickness of the second layer of silicon oxide disposed between the layer of silicon nitride $Si_3N_4$ and the control gate may vary between 20 and 50 Angstroms, 1 Å=$10^{-10}$ m, depending on the technologies used. This layer may be formed by conventional thermal oxidation or by a deposition technique of one type or another.

However, it is crucial to control the quality and thickness of this second layer of oxide since these factors primarily contribute to ensuring that the memory cell produced does not age, ageing implying the loss of electric charges after programming. For a more detailed description of the correlation between the phenomenon of ageing in this type of EPROM memory cell and the silicon thickness, reference may be made to the articles entitled:

Threshold Voltage Instability and Charge Retention in Non-volatile Memory Cell with Nitride/Oxide/Nitride double-layered Inter-poly Dielectric, published by Seiichi Mori et al. 1991/IEEE/IRPS;

Bottom-ox scaling for thin Nitride/oxide interpoly dielectric, published by Seiichi Mori et al. IEEE Transactions on Electronic Devices, Vol.39, No 2, February 1992 ;

Thickness Scaling Limitation Factors of ONO Interpoly Dielectrics, Seiichi Mori et al. IEEE Transactions on Electronic Devices, Vol.43, No 12, January 1996.

At present, when running the processes to manufacture EPROM memory cells, the controls which have to be carried out on this thickness are generally delayed, being carried out on a separate silicon sample using an appropriate measuring apparatus, i.e. not as part of the manufacturing process applied to the production plates. Accordingly, apart from incurring a loss of the time needed to take a delayed measurement, the above-mentioned measuring technique poses a major problem in terms of reliability because the kinetics of oxidation on silicon and on silicon nitride can be very different. Consequently, for a same thickness of silicon oxide formed on a silicon sample, the corresponding silicon oxide may vary by a factor of 1 to ⅓ on the production plate. Furthermore, producing this layer of silicon oxide requires the use of high-performance measuring equipment in order to take a measurement of this layer on this sample.

SUMMARY OF THE INVENTION

The objective of this invention is to remedy the above-mentioned drawbacks of the prior art by eliminating the use of a sample silicon oxide deposition and by operating a method of measuring the thickness of a layer of an integrated circuit in real time during the production process, in particular when engraving this integrated circuit.

The method of measuring the thickness of a layer of an integrated circuit in real time, which will be referred to as the thickness to be measured, deposited on an underlying layer, is performed during an operation whereby the substrate of this integrated circuit incorporating these layers is engraved.

It is remarkable in that it consists in tracking the forward movement of the engraving front of each layer of the integrated circuit by plotting the optical emission spectrum of the product of the engraving reaction in real time on at least one spectral component of the underlying layer, establishing a distribution of the amplitude of the optical emission of the engraving reaction product as a function of time and determining the transition of the optical emission on this distribution as the engraving front passes from the layer to be measured to the underlying layer. The thickness of the layer to be measured is calculated on the basis of this distribution and the transition by means of a correlation to this transition on this distribution.

The method proposed by the invention may be applied to measuring the thickness of integrated circuit layers deposited on an underlying layer of any type but is more particularly suited to measuring the thickness of the second silicon oxide layer deposited on an underlying layer of silicon nitride, such as used to produce EPROM cells on an industrial scale.

BRIEF DESCRIPTION OF THE DRAWINGS

The invention will be more readily understood from the description below and with reference to the appended drawings, of which, apart from FIGS. 1a and 1b relating to the prior art.

DETAILED DESCRIPTION OF THE INVENTION

Generally speaking, it should be pointed out that the method of measuring the thickness of a layer of an integrated circuit in real time may be applied as a means of measuring layers of any type during the process of engraving an integrated circuit of any type.

The integrated circuit or the substrate forming a base therefor is placed in a reactor such as a reactor of the diode type, the electromagnetic excitation being a radio frequency or microwave excitation in which an atmosphere suitable for engraving purposes is created. The method proposed by the invention may be operated using any equipment of the mono-plate type, controlled by a microprocessor to produce an adaptation of the material which will be described farther on in the description.

Firstly, however, various aspects relating specifically to the way in which the method proposed by the invention is operated as a means of determining the thickness of the second layer of oxide $SiO_2$ of a memory cell of the EPROM type will be described in order to illustrate a specific implementing mode of said method, although this is not restrictive.

Figure 2:
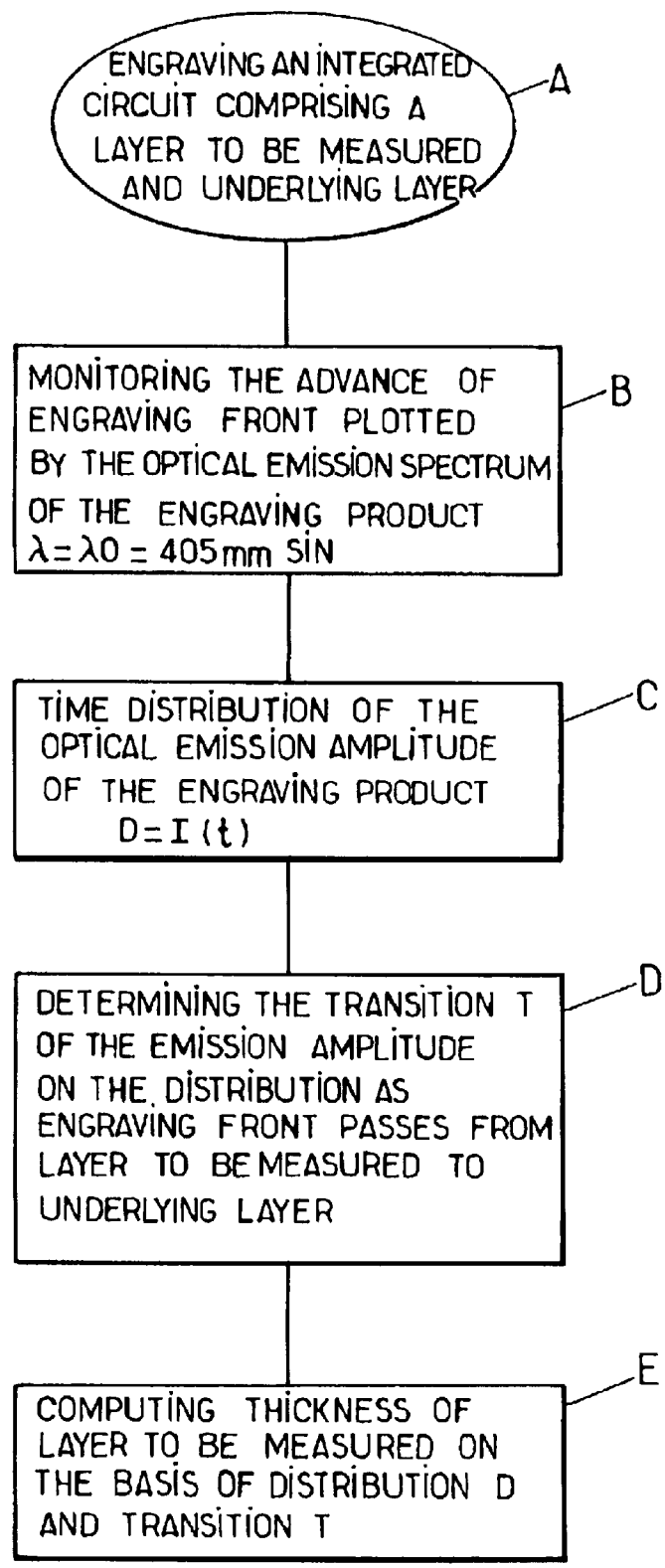
FIG. 2 is a flow chart, given purely by way of illustration, setting out the steps of the method proposed by the invention.

Turning to FIG. 2, the integrated circuit or base substrate thereof comprises a layer to be measured and an underlying layer, this integrated circuit being placed, at step A, in the engraving reactor mentioned above.

As illustrated in FIG. 2, the method proposed by the invention consists in plotting, during a step B, the engraving front as it advances in each integrated circuit layer by plotting the optical emission spectrum of the engraving reaction product in real time on at least one spectral component of said underlying layer. More specifically, the engraving front is constituted by the engraving atmosphere created in the reactor, this engraving atmosphere being the atmosphere created during the actual engraving process under said engraving conditions, as it encounters the actual layer being engraved as such. The product of the engraving reaction essentially consists of the engraving atmosphere, which is substantially modified as the layers are encountered in succession by aforesaid engraving front.

By virtue of one remarkable aspect of the method proposed by this invention, the spectral component of the underlying layer is determined by a wavelength $\lambda=\lambda_0$ characteristic of said underlying layer. Accordingly, the optical emission from the engraving reaction product for the spectral component, i.e. said wavelength, enables the engraving front to be verified as it advances in succession through the layers it encounters, as will be described below.

The optical emission spectrum of the engraving reaction product is established on the basis of the amplitude of the optical emission from the engraving product for said spectral component, i.e. the wavelength $\lambda=\lambda_0$.

Under these conditions, said step B is then followed by a step C, which consists in establishing, as a function of time, a distribution, written as D, of the optical emission amplitude of the product of said engraving reaction, this distribution being written $D=I(t)$.

In accordance with one remarkable aspect of the method proposed by this invention, it then consists, at a step D, in determining, on said distribution D, the transition of the amplitude of the optical emission as the engraving front passes from the layer to be measured to the underlying layer. Having determined this, it is then possible to measure a time value from a start of engraving, this time value constituting a measurement of the time taken by the engraving front to reach said underlying layer. The transition T is defined on the basis of numerical elements taking account in particular of the rising wave front of the transition denoted as T.

Step D is then followed by a step E, which consists in calculating the thickness of the layer to be measured from the distribution D and the transition T, by correlating this transition with the position in time on said distribution D.

Given that the spectral component of the underlying layer is a perceptible emission wavelength $\lambda_0$ characteristic of said underlying layer, if the layer to be measured is the second layer of silicon oxide and the underlying layer is a barrier layer of silicon nitride such as incorporated in the aforesaid EPROM memory cells, the spectral component of the underlying layer is the spectral line of the silicon nitride at 405 nm.

A more detailed description of how steps C, D and E of the method set out in FIG. 2 are operated will now be given with reference to FIGS. 3 and 4 using the example of measuring the thickness of the second layer of said silicon oxide, although this is not restrictive.

Figure 1A:
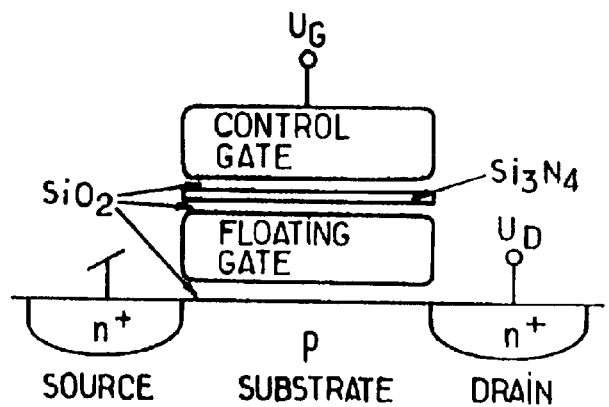
Figure 1B:
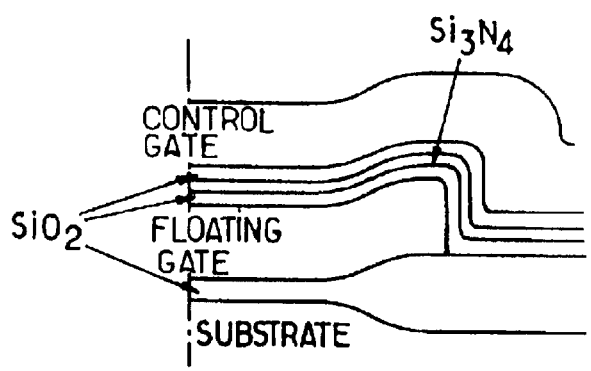

In this situation, the method proposed by the invention is implemented during the production of EPROM cells, which require a large number of manufacturing steps, only the essential steps of which are described in a simplified manner and by way of illustration in figures 1a and 1b.

To produce an EPROM cell of the type illustrated in aforesaid drawings, in addition to the steps needed to prepare the silicon substrate, it is also necessary to:
  a) form the first layer of silicon oxide;
  b) form the barrier layer of silicon nitride $Si_3N_4$ ;
  c) form the second layer of silicon oxide;
  d) apply a photosensitive resin;
  e) expose, by means of a photo-lithographic machine, a reticule defining the zones in which the layered stack of a first silicon oxide, silicon nitride and the second silicon oxide will be formed as illustrated in said figures 1a and 1b;
  f) develop the photosensitive resin;
  g) engrave the useless residual stack in a plasma reactor in order to ensure that the cell configured as illustrated in 1a and 1b will function.

Within said manufacturing process, the method proposed by the invention as a means of controlling the thickness of the second layer of silicon oxide produced at step c) is operated during aforesaid step e).

Step B, during which the engraving front in the method proposed by the invention is plotted as it moves forward, consists in detecting the characteristic wavelength $\lambda_0 = 405$ nm of the silicon nitride and measuring the amplitude of the optical emission of the engraving product. In particular, it should be pointed out that the values of the optical emission amplitude may be stored in memory as a means of plotting said engraving front as it advances.

Figure 3:
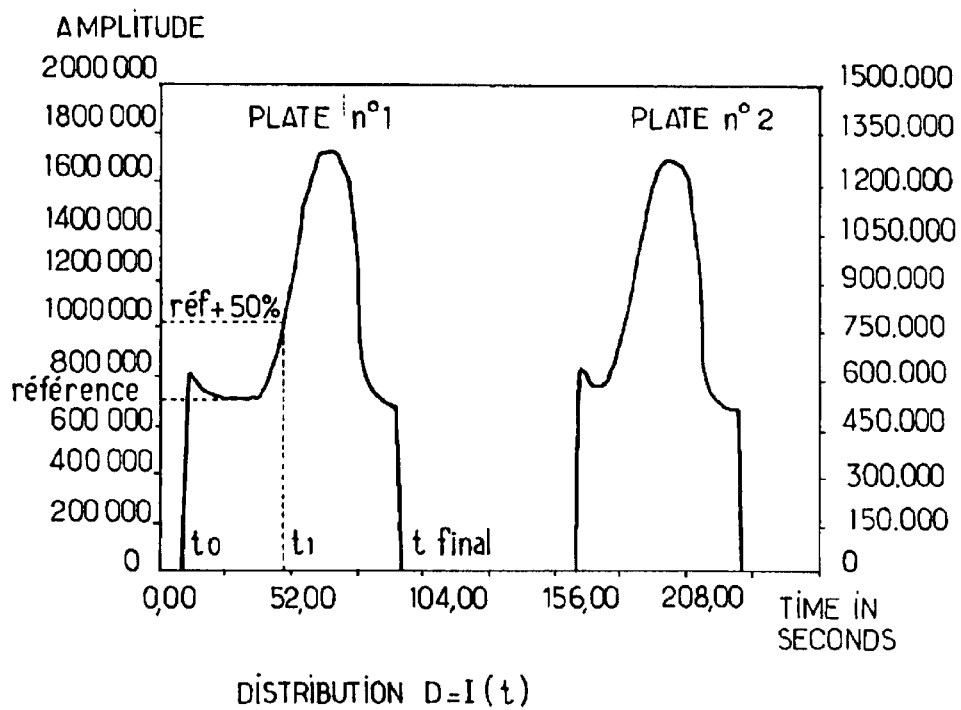
FIG. 3 is a time distribution diagram showing the amplitude of the optical emission from the engraving product for a spectral component of the layer of silicon nitride underneath the layer to be measured.
Figure 4:
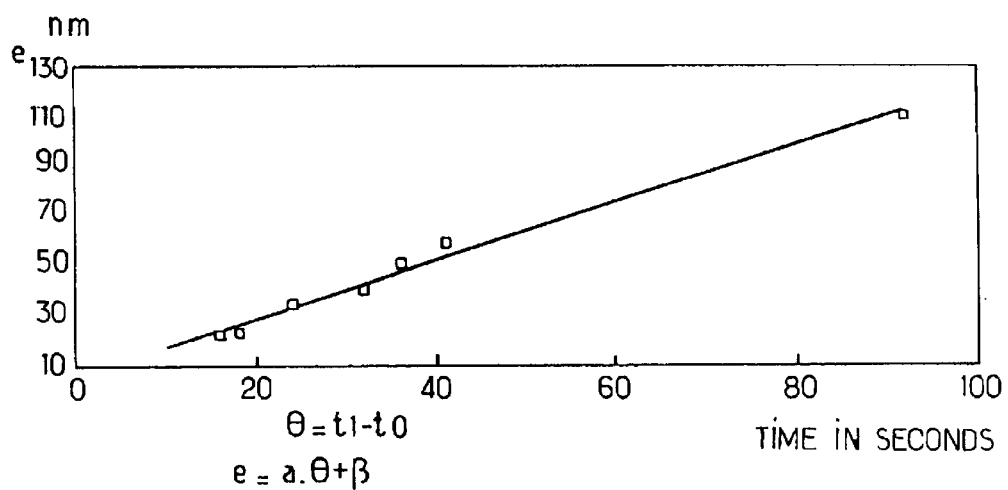
FIG. 4 represents a law of scaling for the effective thickness of the layer to be measured as a function of the engraving time between the start of engraving to the transition in the distribution amplitude, where the layer to be measured is silicon oxide and the underlying layer is silicon nitride.

At step C, a set of values illustrated in FIG. 3 is available after conducting step B, these values constituting optical emission amplitude values of the engraving product as a function of time I(t).

FIG. 3 shows a relative optical emission amplitude during the process of engraving a base substrate of an EPROM memory cell for a plate no 1 and a plate no 2 serving as a sample plate, respectively. The axis of the ordinates is graded in relative amplitude values and the axis of the abscissa in time in seconds. The distribution $D=I(t)$ representing optical emission plotted as a function of time produces a curve of the "bell-shaped curves" type. The amplitude of the emission increases as the nitride layer appears, the second layer of oxide, which is the layer to be measured, then being engraved, after which it disappears as the engraving front reaches the first layer of oxide.

At step C, a time distribution is therefore produced of the optical emission amplitude of the engraving product, the distribution D=I(t).

Step D consists in determining the position in time at which the transition T in the emission amplitude occurs along the distribution as the engraving front passes from the layer to be measured to the underlying layer and this can advantageously be determined by pinpointing a significant increase in the level of the emission amplitude caused by this passage.

Turning to aforesaid FIG. 3, it should be pointed out that, for the distribution considered, the amplitude of optical emission at the start of engraving, i.e. during the process of engraving the layer corresponding to the control gate, corresponds to a substantially constant optical emission amplitude because the distinction is made on the basis of the wavelength $\lambda_0$ characteristic of the underlying layer $Si_3N_4$.

By way of example, although this is not restrictive, the significant increase can then be taken as an increase of 50% in the value of the optical emission amplitude during engraving of the control gate, this initial amplitude essentially constituting a reference amplitude for the distribution D considered.

Accordingly, whilst the amplitude of optical emission is substantially constant for the control gate and the second layer of oxide $SiO_2$, the underlying layer $Si_3N_4$ causes an abrupt increase in emission amplitude when encountered by the engraving flank due to a high optical emission immediately the engraving front encounters said subjacent layer.

Consequently, it is possible to define on the abovementioned distribution D an initial engraving time, written $t_0$, and a time $t_1$, at which said underlying layer is assumed to have been reached when the above-mentioned optical emission level increased by 50% has been reached.

Step D may then be followed by step E, which, on the basis of the distribution D and the transition T located by the instants $t_0$ and $t_1$, consists in calculating the thickness of the layer to be measured, i.e. the second layer of oxide, by applying a correlation between the time elapsed between the start of engraving at the instant to and the instant $t_1$ at which the underlying layer was reached.

By virtue of one remarkable aspect of the method proposed by the present invention, because the engraving speed remains substantially constant as the engraving front advances through the different layers it encounters, the correlation between the thickness of the layer to be measured, written e, and the position of the transition T on the distribution D, may advantageously be applied on the basis of a linear combination linking the engraving time, i.e. the duration $t_1-t_0$, and the calculated thickness, e, of the layer to be measured. In effect, because the distinction is made on the basis of the wavelength $\lambda_0$ associated with the underlying layer, the advent of the transition T is short enough, with a substantially constant engraving speed prior to this transition, for the effective thickness of the layer being measured to verify said linear combination.

Clearly, the parameters for aforesaid linear combination may be determined by calibration depending on the respective nature of the layer to be measured and the underlying layer.

An example of how the effective thickness of the layer to be measured is calculated will now be given in the case where this layer is aforesaid second layer of silicon oxide of an EPROM memory cell, with reference to FIG. 4.

Turning to said figure, under specific engraving conditions, the effective thickness of the second layer of silicon oxide verifies the equation $e=a.\theta+\beta$. In the equation given above, $\theta$ denotes aforesaid time $t_1-t_0$, $\underline{a}$ represents a slope value for said linear combination, $a=1.16$ and $\beta$ represents the initial ordinate, which is substantially $\beta=5,16$. The effective thickness values obtained are given in nm for a time $\theta$ expressed in seconds.

Figure 5:
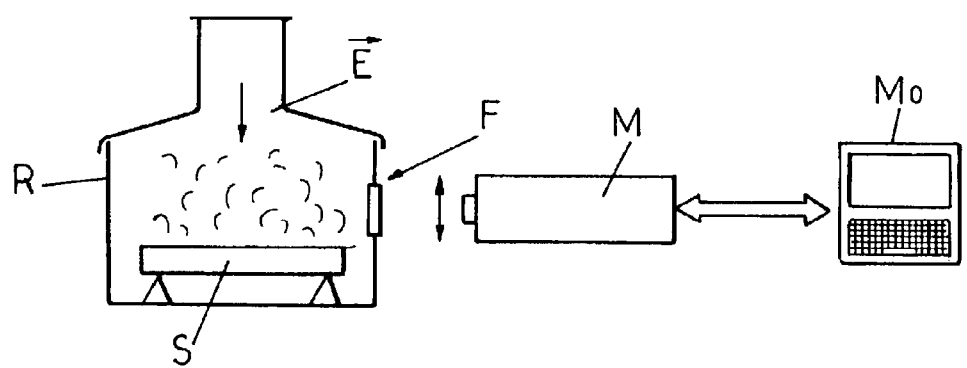
FIG. 5 is a diagram illustrating the plant used to operate the method proposed by the present invention.

The method proposed by the invention can be operated by means of the plant illustrated in FIG. 5.

Whilst the reactor R contains the substrate S subjected to the plasma engraving process, represented by the electric field E, said reactor R may advantageously be provided with a quartz window F so that the engraving product can be observed by means of a monochromator M, the wavelength of which is centred on the value $\lambda_0$ mentioned earlier in the description. The monochromator M may then be advantageously connected to a microcomputer MO which manages the measurement data of the optical emission amplitude of the engraving product supplied by the monochromator M.

The microcomputer MO may advantageously contain an acquisition programme for picking up the distribution parameters D, in particular the value of the time $\theta$ mentioned above, this acquisition process being run during the engraving process.

Finally, a computing programme may be used in which parameters enabling the layer to be measured, the underlying layer and the wavelength associated with the latter to be characterised are entered, so that the parameters of the linear combination $\underline{a}$ and $\beta$ can be determined from a specific data base and, of course, the effective thickness of the layer to be measured computed directly.

The method and plant described above as a means of measuring the thickness of a layer of an integrated circuit in real time are particularly powerful due to the fact that the oxide thickness is measured as the integrated circuit is being engraved, i.e. without any operations delayed in time that are likely to lengthen the actual manufacturing process, which is why the method proposed by the invention can be said to be a real-time measuring method. Accordingly, the thickness of the layer to be measured is actually measured for each processed substrate directly on the production plate as it passes through the engraving reactor.

What is claimed is:

1. A method for measuring a thickness of a first layer, said first layer to be measured being deposited on a second layer which is underneath said first layer, said first and second layers being part of an integrated circuit, said method being carried out, in real time, during an engraving reaction wherein an engraving front progresses from said first layer to said second, underneath layer, said engraving front progressing at a predetermined speed, and said engraving reaction, when applied to said second, underneath layer, generating a light emission having at least one spectral component, said method comprising the steps of:
  a) measuring an amplitude of light emitted during the engraving reaction, in a selected spectral range comprising said at least one spectral component;
  b) establishing a distribution of said amplitude as a function of time;

c) determining, from said distribution, a moment of occurrence of an increase in said measured amplitude, said moment corresponding to a point in time at which the engraving front reaches the second, underneath layer;

d) and computing the thickness of said first layer to be measured, on the basis of said moment and said predetermined speed of the engraving front.

2. The method of claim 1, wherein said spectral component of said underneath layer is a perceptible emission wavelength characteristic of said underneath layer.

3. The method of claim 1, wherein said first layer to be measured comprises a layer of silicon oxide and the second, underneath layer comprises a barrier layer of silicon nitride, and wherein said at least one spectral component of said light emission generated when said engraving reaction is applied to said second, underneath layer is a spectral line SiN at 405 nm.

4. The method of claim 1, wherein:

distribution starts from a beginning time of the engraving reaction at which said amplitude constitutes a reference amplitude, and a further time, corresponding to said moment, when said amplitude reaches 150% of the reference amplitude.

5. The method of claim 1, wherein the step comprising measuring the amplitude of said light emitted is performed by means of a monochromator.

6. A device for measuring a thickness of a first layer, said first layer to be measured being deposited on a second layer which is underneath said first layer, said first and second layers being part of an integrated circuit;

the measuring of the thickness of said first layer, in real time, during an engraving reaction wherein an engraving front progresses from said first layer to said second, underneath layer, said engraving front progressing at a predetermined speed, and said engraving reaction, when applied to said second, underneath layer, generating a light emission having at least one spectral component, said device comprising:

first means for measuring an amplitude of light emitted during the engraving reaction, in a selected spectral range comprising said at least one spectral component;

and second means for:

establishing a distribution of said amplitude as a function of time;

determining, from said distribution, a moment of occurrence of an increase of said measure amplitude, said moment corresponding to a point in time at which the engraving front reaches the second underneath layer; and computing the thickness of said first layer to be measured, on the basis of said moment and said predetermined speed of the engraving front.

7. The device of claim 6, further comprising:

a reactor for engraving said integrated circuit, said reactor being fitted with an optical window enabling the engraving reaction to be optically observed;

a monochromator, the wavelength of which is centered on a characteristic value of said second, underneath layer, for enabling amplitude values of the emitted light to be measured; and means for determining a time period taken by the engraving front produced within said reactor to reach the second, underneath layer and for computing an effective thickness of said first layer to be measured by a linear combination linking said effective thickness to the time taken by said engraving front to reach said second, underneath layer.

* * * * *